(12) United States Patent
Happ et al.

(10) Patent No.: US 8,250,293 B2
(45) Date of Patent: Aug. 21, 2012

(54) DATA EXCHANGE IN RESISTANCE CHANGING MEMORY FOR IMPROVED ENDURANCE

(75) Inventors: Thomas Happ, Munich (DE); Jan Boris Philipp, Munich (DE)

(73) Assignee: Qimonda AG, Munich (DE)

( * ) Notice: Subject to any disclaimer, the term of this patent is extended or adjusted under 35 U.S.C. 154(b) by 146 days.

(21) Appl. No.: 12/687,951

(22) Filed: Jan. 15, 2010

(65) Prior Publication Data
US 2010/0293350 A1    Nov. 18, 2010

(30) Foreign Application Priority Data
Jan. 19, 2009  (EP) .................................... 09000665

(51) Int. Cl.
*G06F 12/10* (2006.01)
*G06F 12/16* (2006.01)

(52) U.S. Cl. ............ 711/103; 711/E12.008; 711/E12.01
(58) Field of Classification Search .................. 711/103, 711/E12.007, E12.008, E12.01
See application file for complete search history.

(56) References Cited

U.S. PATENT DOCUMENTS

| | | | |
|---|---|---|---|
| 6,000,006 A * | 12/1999 | Bruce et al. ................... | 711/103 |
| 8,001,318 B1 * | 8/2011 | Iyer et al. ...................... | 711/103 |
| 2005/0114589 A1 * | 5/2005 | Lofgren et al. ............... | 711/103 |
| 2007/0083698 A1 * | 4/2007 | Gonzalez et al. ............. | 711/103 |
| 2007/0214309 A1 * | 9/2007 | Matsuura et al. ............. | 711/103 |
| 2009/0113121 A1 * | 4/2009 | Lee et al. ...................... | 711/103 |
| 2009/0182936 A1 * | 7/2009 | Lee ................................ | 711/103 |
| 2010/0100663 A1 * | 4/2010 | Kao et al. ...................... | 711/103 |

* cited by examiner

*Primary Examiner* — Hal Schnee

(57) ABSTRACT

According to one embodiment of the present invention, a method of operating an integrated circuit including a plurality of resistance changing memory cells grouped into physical memory units is provided. The method includes: Monitoring writing access numbers assigned to the physical memory units, each writing access number reflecting the number of writing accesses to the physical memory unit to which the writing access number is assigned; if the value of a writing access number assigned to a first physical memory unit exceeds a writing access threshold value, a data exchange process is carried out during which the data content stored within the first physical memory unit is exchanged with the data content of a second physical memory unit having a writing access number of a lower value.

18 Claims, 14 Drawing Sheets

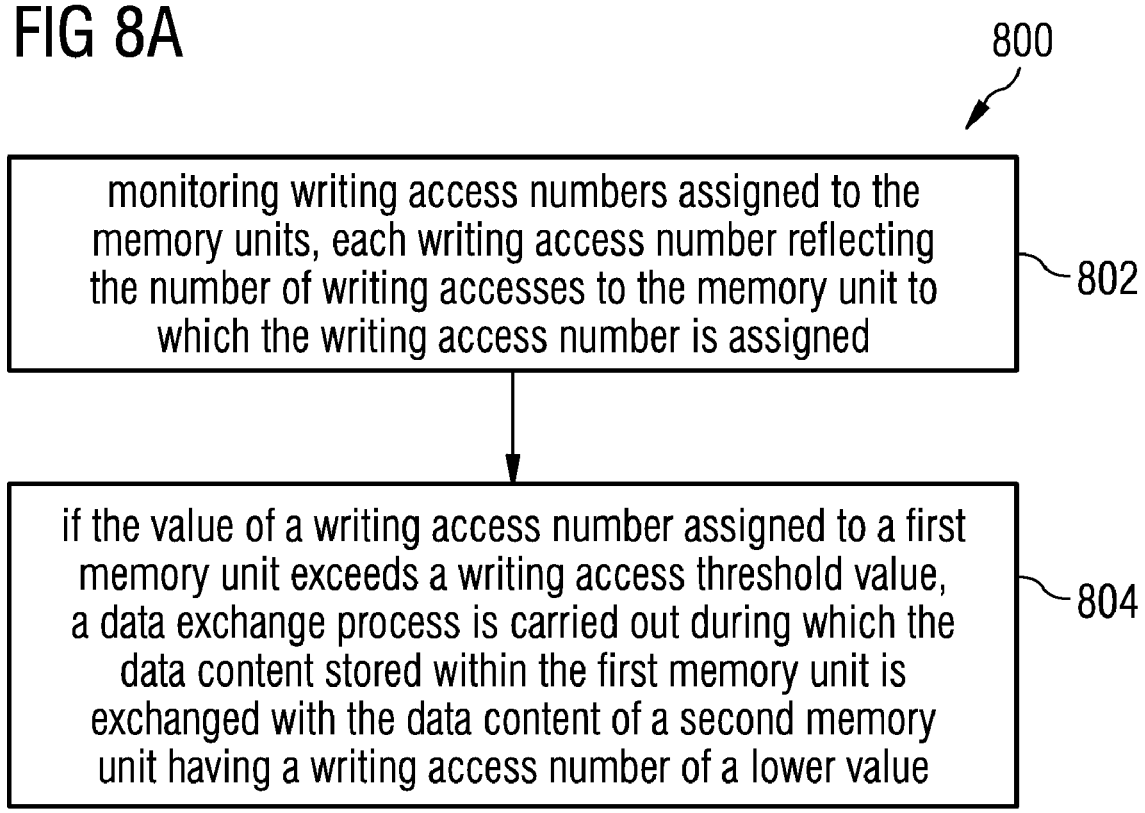

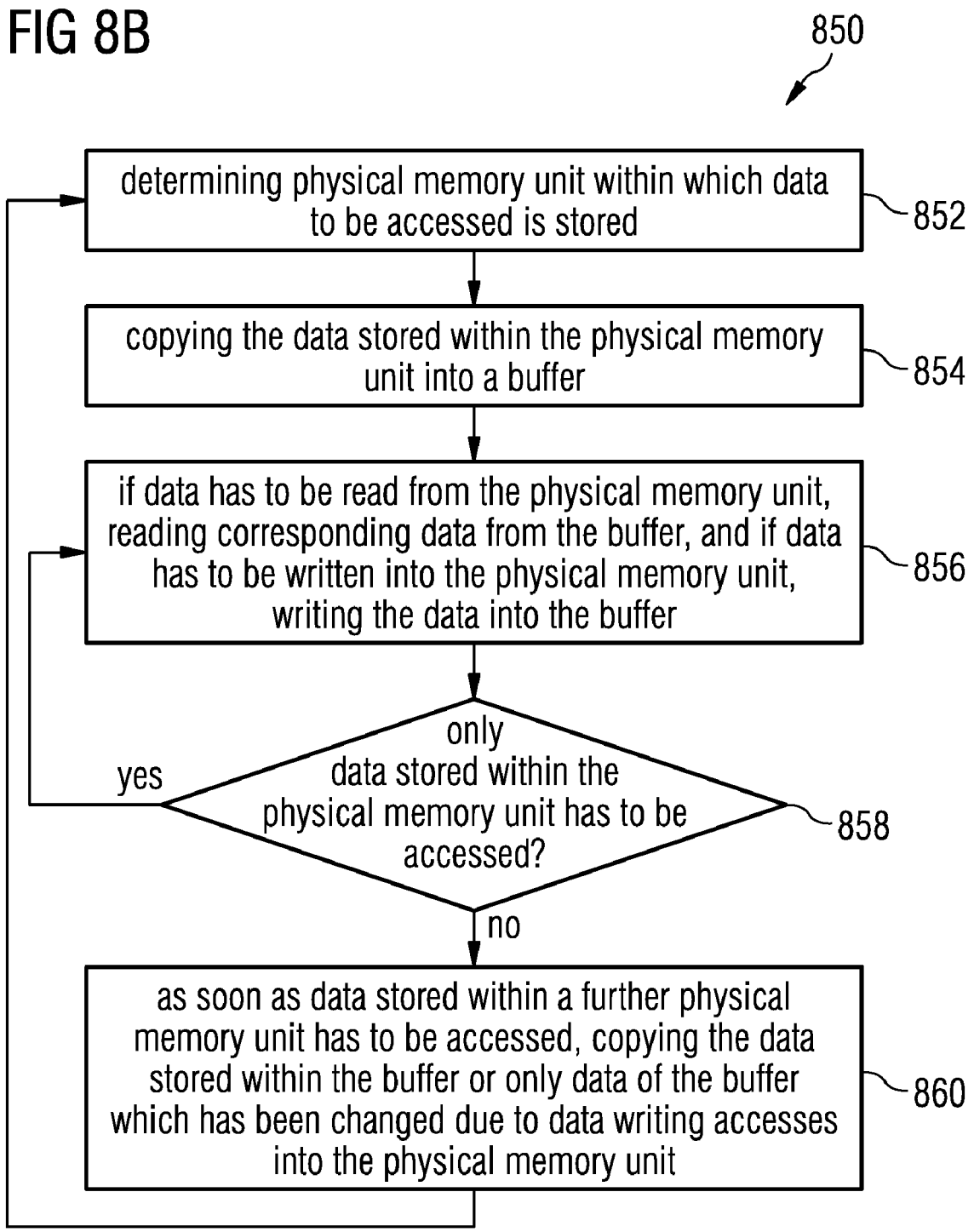

FIG 12

| Logical page adress | Physical page adress |
|---|---|
| 0 | 458 |
| 1 | 125 |
| ... | ... |

$1200_1$ — (row 0/458) — $902_1$
$1200_2$ — (row 1/125) — $902_2$

DATA EXCHANGE IN RESISTANCE CHANGING MEMORY FOR IMPROVED ENDURANCE

TECHNICAL FIELD OF INVENTION

Integrated circuits including resistance changing memory cells are known. It is desirable to improve the endurance of the integrated circuits.

SUMMARY OF THE INVENTION

According to one embodiment of the present invention, a method of operating an integrated circuit including a plurality of resistance changing memory cells grouped into physical memory units, the method including: monitoring writing access numbers assigned to the physical memory units, each writing access number reflecting the number of writing accesses to the physical memory unit to which the writing access number is assigned; if the value of a writing access number assigned to a first memory unit exceeds a writing access threshold value, a data exchange process is carried out during which the data stored within the first physical memory unit is exchanged with the data content of a second physical memory unit having a writing access number of a lower value.

According to one embodiment of the present invention, an integrated circuit is provided, including: a plurality of resistance changing memory cells grouped into physical memory units; a monitoring unit monitoring writing access numbers assigned to the physical memory units, each writing access number reflecting the number of writing accesses to the physical memory unit to which the writing access number is assigned, wherein the monitoring unit triggers, if the value of a writing access number assigned to a first physical memory unit exceeds a writing access threshold value, a data exchange process during which the data content stored within the first physical memory unit is exchanged with the data content of a second physical memory unit having a writing access number of a lower value.

BRIEF DESCRIPTION OF THE DRAWINGS the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 8A shows a flow chart of a method of operating an integrated circuit according to one embodiment of the present invention;

FIG. 8B shows a flow chart of a method of operating an integrated circuit according to one embodiment of the present invention;

FIG. 12 shows a schematic drawing of a memory unit address mapping architecture according to one embodiment of the present invention;

DESCRIPTION

Since the embodiments of the present invention can be applied to phase change memory devices which include resistance changing memory cells (phase change memory cells), a brief discussion of phase change memory devices which may be part of an integrated circuit according to the present invention will be given.

Figure 1A:
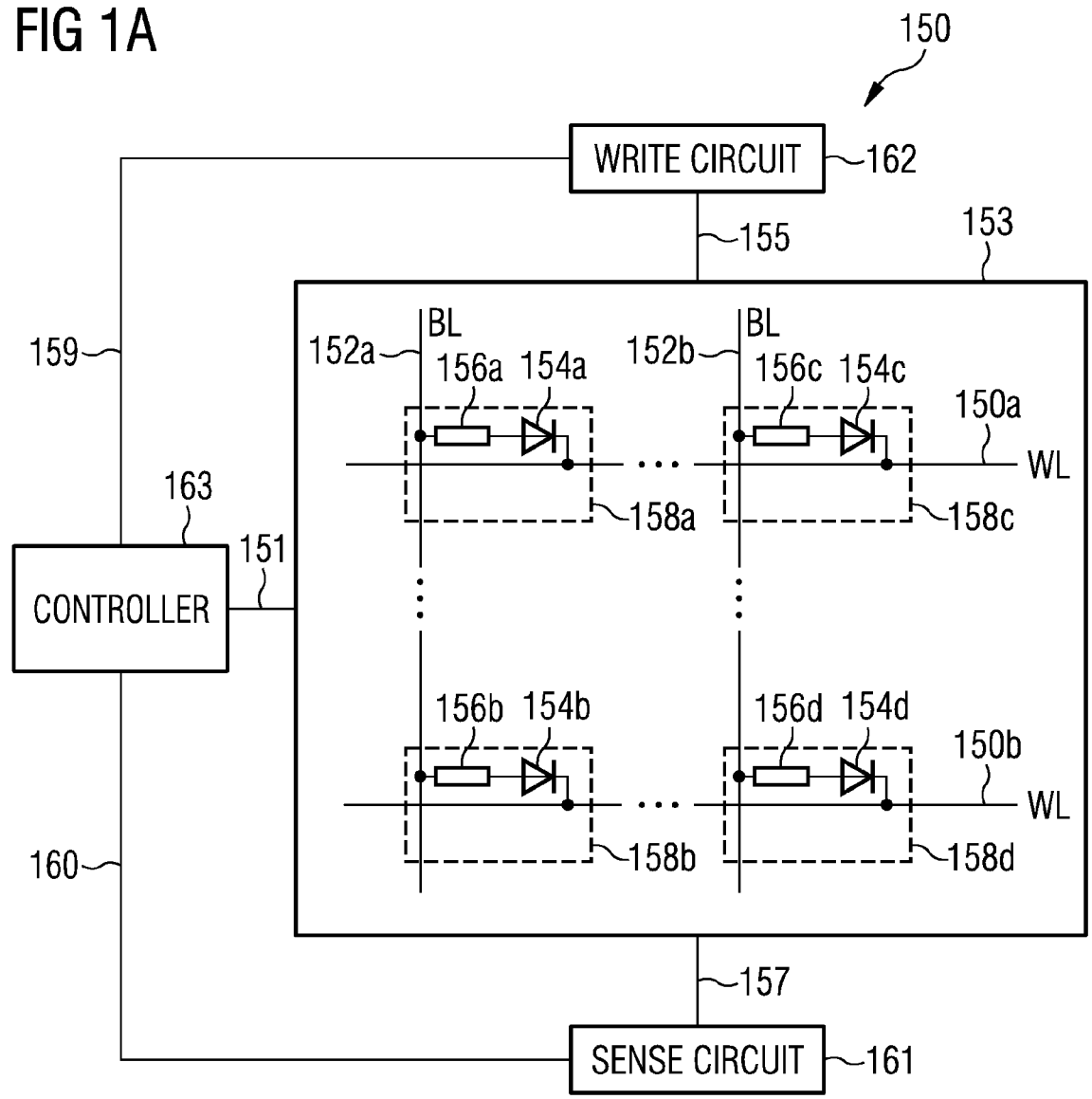
FIG. 1A shows an schematic drawing of an integrated circuit having phase change memory cells.

FIG. 1A shows a phase change memory device 150 having a cell field 153, a writing circuit 162, a sensing circuit 161, a controller 163, and bit lines 152a, 152b being arranged perpendicular to the word lines 150a, 150b. PCRAM elements (phase change elements) 156a-156d are arranged between the bit lines 152a, 152b and the word lines 150a, 150b and are electrically coupled with the bit lines 152a, 152b and the word lines 150a, 150b. Between the PCRAM elements 156a-156d and the word lines 150a, 150b, select devices (here: diodes which may be replaced by field effect transistors, by thyristors, or by bipolar transistors) 154a-154d are arranged, thus forming PCRAM memory cells 158a-158d. The controller 163 controls the sensing circuit 161 and the writing circuit 162 connected to the controller 163 via lines 159, 160. The writing circuit 162 sets the memory states of the memory cells 158a-158d via lines 155, and the reading circuit reads the memory states of the memory cells 158a-158d via lines 157. More details about PCRAM-devices will be given later in conjunction with FIGS. 4 and 5.

Since the embodiments of the present invention can be applied to magneto-resistive memory devices which include resistance changing memory cells (magneto-resistive memory cells), a to brief discussion of magneto-resistive memory devices which may be part of an integrated circuit according to the present invention will be given. Magnetoresistive memory cells involve spin electronics, which combines semiconductor technology and magnetics. The spin of an electron, rather than the charge, is used to indicate the presence of a "1" or "0". One such spin electronic device is a magnetic random-access memory (MRAM), which includes conductive lines positioned perpendicular to one another in different metal layers, the conductive lines sandwiching a magnetic stack. The place where the conductive lines intersect is called a cross-point. A current flowing through one of the conductive lines generates a magnetic field around the conductive line and orients the magnetic polarity into a certain direction along the wire or conductive line. A current flowing through the other conductive line induces the magnetic field and can also partially turn the magnetic polarity. Digital information, represented as a "0" or "1" is stored in the alignment of magnetic moments. The resistance oft the magnetic component depends on the moment's alignment. The stored state is read from the element by detecting the component's resistive state. A memory cell may be constructed by placing the conductive lines and cross-points in a matrix structure or array having rows and columns.

Figure 1B:
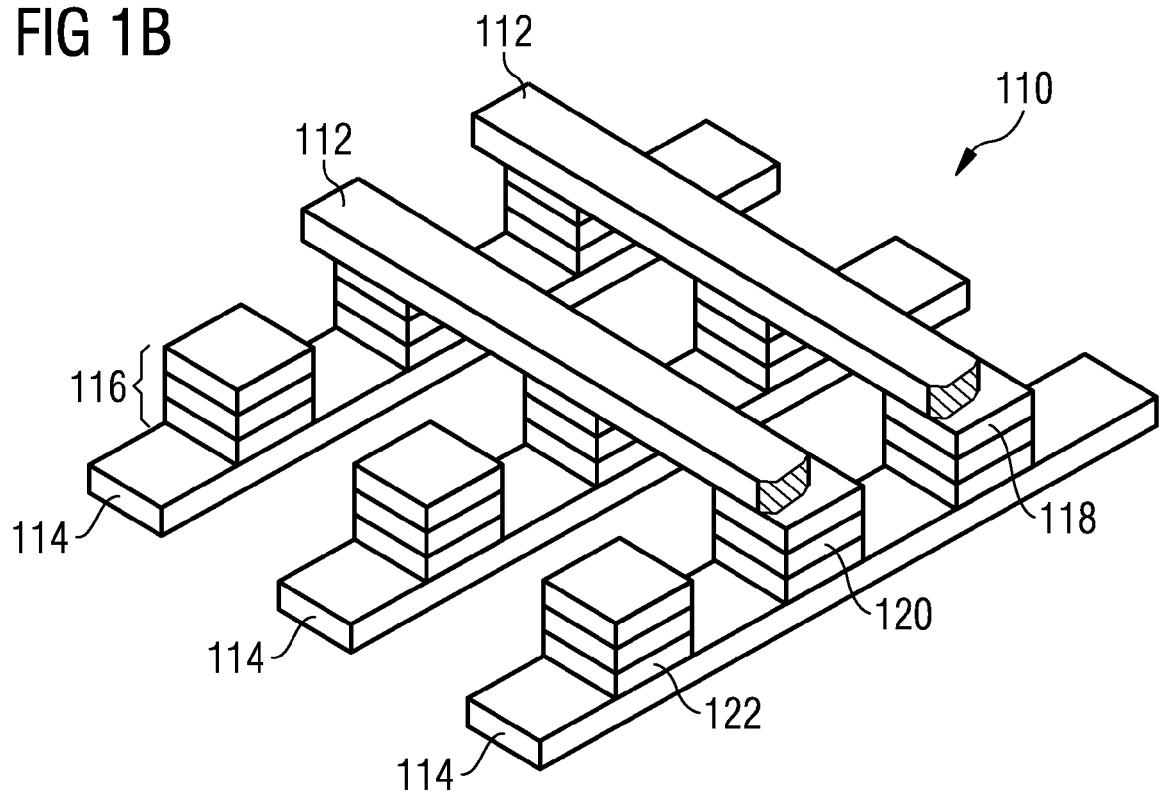
FIG. 1B shows a perspective view of an integrated circuit having magneto-resistive memory cells.

FIG. 1B illustrates a perspective view of a MRAM device 100 having bit lines 112 located orthogonal to word lines 114 in adjacent metallization layers. Magnetic stacks 116 are positioned between the bit lines 112 and word lines 114 adjacent and electrically coupled to bit lines 112 and word lines 114. Magnetic stacks 116 preferably include multiple layers, including a soft layer 118, a tunnel layer 120, and a hard layer 122, for example. Soft layer 118 and hard layer 122 preferably include a plurality of magnetic metal layers, for example, eight to twelve layers of materials such as PtMn, CoFe, Ru, and NiFe, as examples. A logic state is storable in the soft layer 118 of the magnetic stacks 116 located at the junction of the bitlines 112 and word lines 114 by running a current in the appropriate direction within the bit lines 112 and word lines 114 which changes the resistance of the magnetic stacks 116. In order to read the logic state stored in the soft layer 118 of the magnetic stack 116, a schematic such as the one shown in FIG. 2, including a sense amplifier (SA) 230, may be used. A reference voltage $U_R$ is applied to one end of the magnetic stack 116. The other end of the magnetic stack 116 is coupled to a measurement resistor $R_{m1}$ The other end of the measurement resistor $R_{m1}$ is coupled to ground. The current running through the magnetic stack 116 is equal to current $I_{cell}$. A reference circuit 232 supplies a reference current $I_{ref}$ that is run into measurement resistor $R_{m2}$. The other end of the measurement resistor $R_{m2}$ is coupled to ground, as shown.

Figure 3:
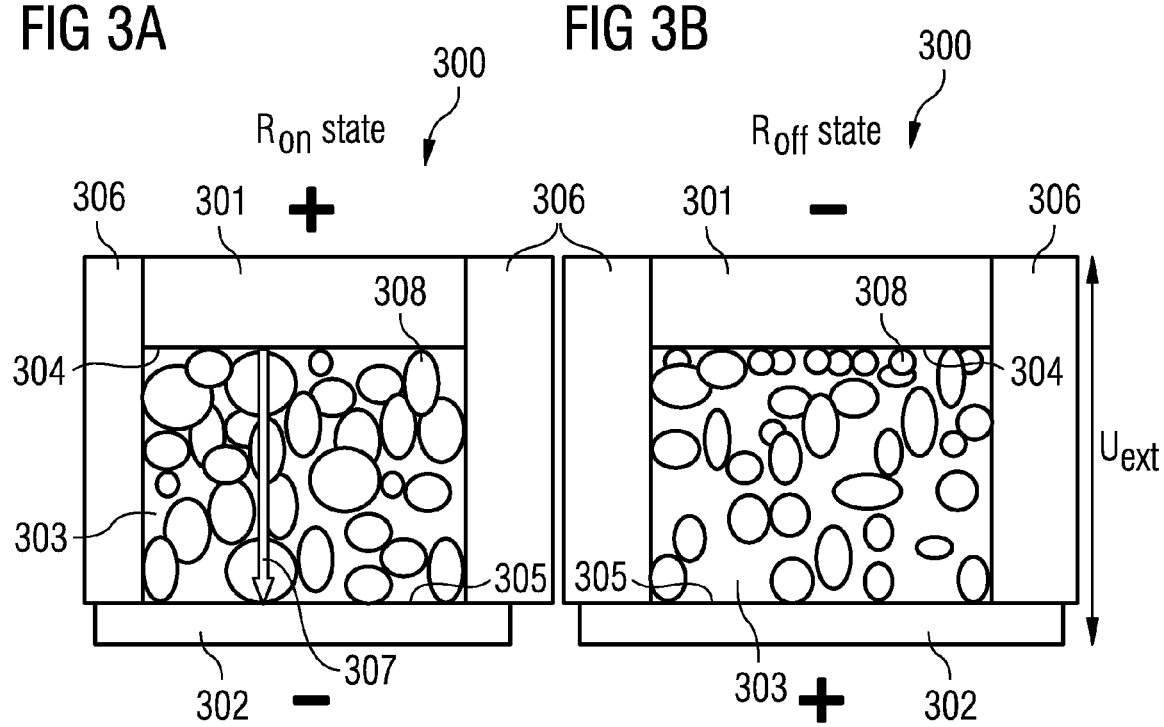
FIG. 3A shows a schematic cross-sectional view of a programmable metallization element set to a first switching state.
FIG. 3B shows a schematic cross-sectional view of a programmable metallization element set to a second switching state.

Since the embodiments of the present invention can be applied to programmable metallization cell devices (PMC) (e.g. solid electrolyte devices like CBRAM (conductive bridging random access memory) devices), in the following description, making reference to FIGS. 3A and 3B, a basic principle underlying embodiments of CBRAM devices which may be part of an integrated circuit according to the present invention will be explained. As shown in FIG. 3A, a CBRAM element 300 includes a first electrode 301 a second electrode 302, and a solid electrolyte block (in the following also referred to as ion conductor block) 303 which includes the active material and which is sandwiched between the first electrode 301 and the second electrode 302. This solid electrolyte block 303 can also be shared between a plurality of memory elements (not shown here). The first electrode 301 contacts a first surface 304 of the ion conductor block 303, the second electrode 302 contacts a second surface 305 of the ion conductor block 303. The ion conductor block 303 is isolated against its environment by an isolation structure 306. The first surface 304 usually is the top surface, the second surface 305 the bottom surface of the ion conductor 303. In the same way, the first electrode 301 generally is the top electrode, and the second electrode 302 the bottom electrode of the CBRAM element. One of the first electrode 301 and the second electrode 302 is a reactive electrode, the other one an inert electrode. Here, the first electrode 301 is the reactive electrode, and the second electrode 302 is the inert electrode. In this example, the first electrode 301 includes silver (Ag), the ion conductor block 303 includes silver-doped chalcogenide material, the second electrode 302 includes tungsten (W), and the isolation structure 306 includes $SiO_2$ or $Si_3N_4$. The present invention is however not restricted to these materials. For example, the first electrode 301 may alternatively or additionally include copper (Cu) or zink (Zn), and the ion conductor block 303 may alternatively or additionally include copper-doped chalcogenide material. Further, the second electrode 302 may alternatively or additionally include nickel (Ni) or platinum (Pt), iridium (Ir), rhenium (Re), tantalum (Ta), titanium (Ti), ruthenium (Ru), molybdenum (Mo), vanadium (V), conductive oxides, silicides, and nitrides of the aforementioned materials, and can also include alloys of the aforementioned materials. The thickness of the ion conductor 303 may for example range between 5 nm and 500 nm. The thickness of the first electrode 301 may for example range between 10 nm and 100 nm. The thickness of the second electrode 302 may for example range between 5 nm and 500 nm, between 15 nm to 150 nm, or between 25 nm and 100 nm. It is to be understood that the present invention is not restricted to the above-mentioned materials and thicknesses.

In the context of this description, chalcogenide material (ion conductor) is to be understood for example as any compound containing oxygen, sulphur, selenium, germanium and/or tellurium. In accordance with one embodiment of the invention, the ion conducting material is for example a compound, which is made of a chalcogenide and at least one metal of the group I or group II of the periodic system, for example arsenic-trisulfide-silver. Alternatively, the chalcogenide material contains germanium-sulfide ($GeS_x$), germanium-selenide ($GeSe_x$), tungsten oxide ($WO_x$), copper sulfide ($CuS_x$) or the like. The ion conducting material may be a solid state electrolyte. Furthermore, the ion conducting material can be made of a chalcogenide material containing metal ions, wherein the metal ions can be made of a metal, which is selected from a group consisting of silver, copper and zinc or of a combination or an alloy of these metals.

If a voltage as indicated in FIG. 3A is applied across the ion conductor block 303, a redox reaction is initiated which drives $Ag^+$ ions out of the first electrode 301 into the ion conductor block 303 where they are reduced to Ag, thereby forming Ag rich clusters 308 within the ion conductor block 303. If the voltage applied across the ion conductor block 303 is applied for an enhanced period of time, the size and the number of Ag rich clusters within the ion conductor block 303 is increased to such an extent that a conductive bridge 307 between the first electrode 301 and the second electrode 302 is formed. In case that a voltage is applied across the ion conductor 303 as shown in FIG. 3B (inverse voltage compared to the voltage applied in FIG. 3A), a redox reaction is initiated which drives $Ag^+$ ions out of the ion conductor block 303 into the first electrode 301 where they are reduced to Ag. As a consequence, the size and the number of Ag rich clusters within the ion conductor block 303 is reduced, thereby erasing the conductive bridge 307. After having applied the voltage/inverse voltage, the memory element 300 remains within the corresponding defined switching state even if the voltage/inverse voltage has been removed.

In order to determine the current memory status of a CBRAM element, for example a sensing current is routed through the CBRAM element. The sensing current experiences a high resistance in case no conductive bridge 307 exists within the CBRAM element, and experiences a low resistance in case a conductive bridge 307 exists within the CBRAM element. A high resistance may for example represent "0", whereas a low resistance represents "1", or vice versa. The memory status detection may also be carried out using sensing voltages. Alternatively, a sensing voltage may be used in order to determine the current memory status of a CBRAM element.

Since the embodiments of the present invention can be applied to phase change memory devices, in the following description, a basic principle underlying embodiments of PCRAM devices will be explained.

According to one embodiment of the invention, the resistance changing memory elements are phase change memory elements that include a phase change material. The phase change material can be switched between at least two different crystallization states (i.e. the phase change material may adopt at least two different degrees of crystallization), wherein each crystallization state may be used to represent a memory state. When the number of possible crystallization states is two, the crystallization state having a high degree of crystallization is also referred to as "crystalline state", whereas the crystallization state having a low degree of crystallization is also referred to as "amorphous state". Different crystallization states can be distinguished from each other by their differing electrical properties, and in particular by their different resistances. For example, a crystallization state having a high degree of crystallization (ordered atomic structure) generally has a lower resistance than a crystallization state having a low degree of crystallization (disordered atomic structure). For sake of simplicity, it will be assumed in the following that the phase change material can adopt two crystallization states (an "amorphous state" and a "crystalline state"), however it will be understood that additional intermediate states may also be used to store multiple bits of data.

Phase change memory elements may change from the amorphous state to the crystalline state (and vice versa) due to temperature changes of the phase change material. These temperature changes may be caused using different approaches. For example, a current may be driven through the phase change material (or a voltage may be applied across the phase change material). Alternatively, a current or a voltage may be fed to a resistive heater which is disposed adjacent to the phase change material. To determine the memory state of a resistance changing memory element, a sensing current may routed through the phase change material (or a sensing voltage may be applied across the phase change material), thereby sensing its resistance which represents the memory state of the memory element.

Figure 4:
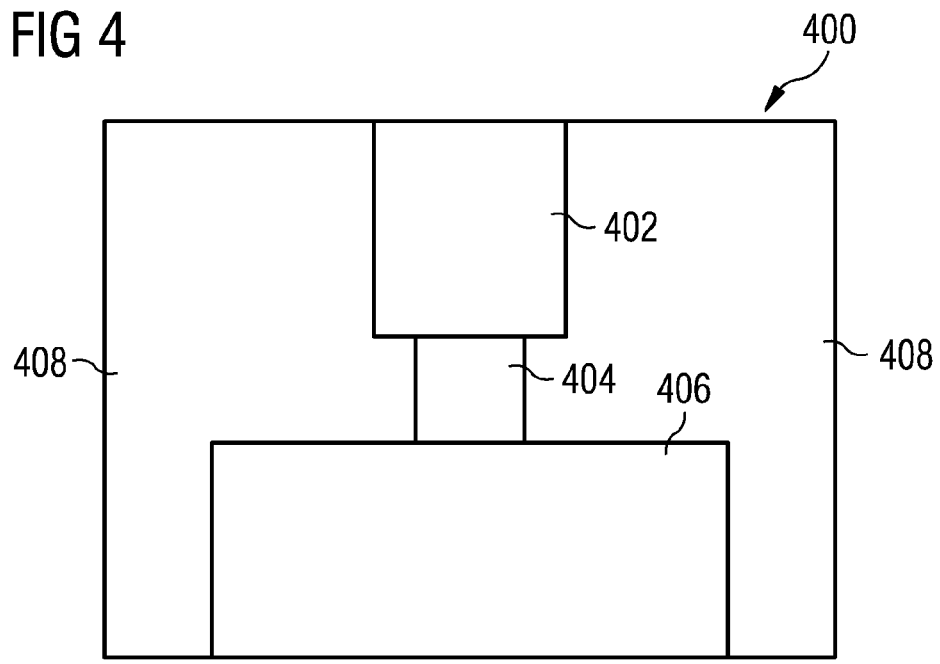
FIG. 4 shows a schematic cross-sectional view of a phase change memory element.

FIG. 4 illustrates a cross-sectional view of an exemplary phase change memory element 400 (active-in-via type). The phase change memory element 400 includes a first electrode 402, a phase change material 404, a second electrode 406, and an insulating material 408. The phase change material 404 is laterally enclosed by the insulating material 408. To use the phase change memory element, a selection device (not shown), such as a transistor, a diode, or another active device, may be coupled to the first electrode 402 or to the second electrode 406 to control the application of a current or a voltage to the phase change material 404 via the first electrode 402 and/or the second electrode 406. To set the phase change material 404 to the crystalline state, a current pulse and/or voltage pulse may be applied to the phase change material 404, wherein the pulse parameters are chosen such that the phase change material 404 is heated above its crystallization temperature To reset the phase change material 404 to the amorphous state, a current pulse and/or voltage pulse may be applied to the phase change material 404, wherein the pulse parameters are chosen such that the phase change material 404 is briefly heated above its melting temperature, and is quickly cooled. The phase change material 404 may include a variety of materials. According to one embodiment, the phase change material 404 may include or consist of a chalcogenide alloy that includes one or more elements from group VI of the periodic table. According to another embodiment, the phase change material 404 may include or consist of a chalcogenide compound material, such as GeSbTe, SbTe, GeTe or AgInSbTe. According to a further embodiment, the phase change material 402 may include or consist of chalcogen free material, such as GeSb, GaSb, InSb, or GeGaInSb. According to still another embodiment, the phase change material 402 may include or consist of any suitable material including one or more of the elements Ge, Sb, Te, Ga, Bi, Pb, Sn, Si, P, O, As, In, Se, and S.

According to one embodiment, at least one of the first electrode 402 and the second electrode 406 may include or consist of Ti, C, Si, V, Cr, Zr, Nb, Mo, Hf, Ta, W, or mixtures or alloys thereof. According to another embodiment, at least one of the first electrode 402 and the second electrode 406 may include or consist of Ti, V, Cr, Zr, Nb, Mo, Hf, Ta, W and one or more elements selected from the group consisting of B, C, N, O, Al, Si, P, S, and/or mixtures and alloys thereof. Examples of such materials include TiCN, TiAlN, TiSiN, W—$Al_2O_3$ and Cr—$Al_2O_3$.

Figure 2:
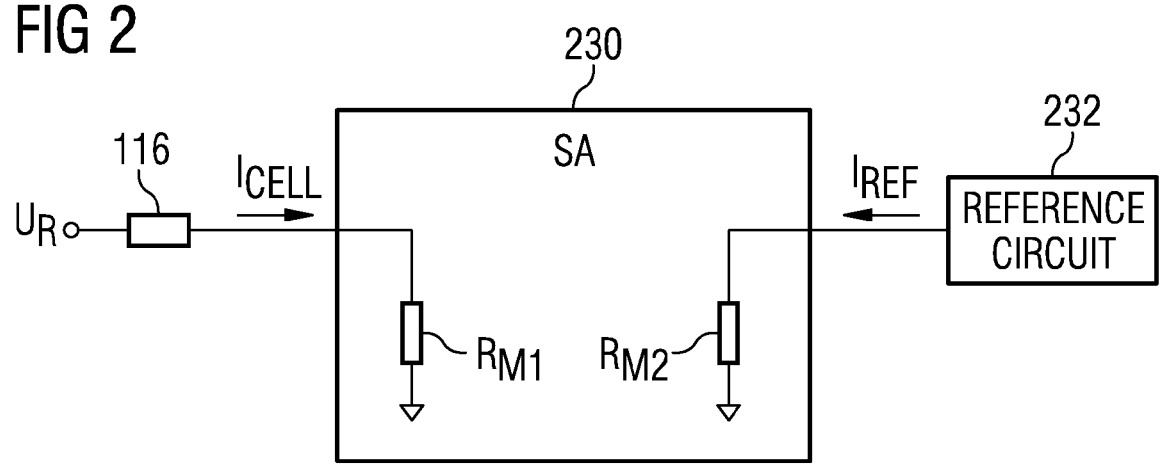
FIG. 2 shows a schematic drawing of a circuit usable in conjunction with the integrated circuit shown in FIG. 1.
Figure 5:
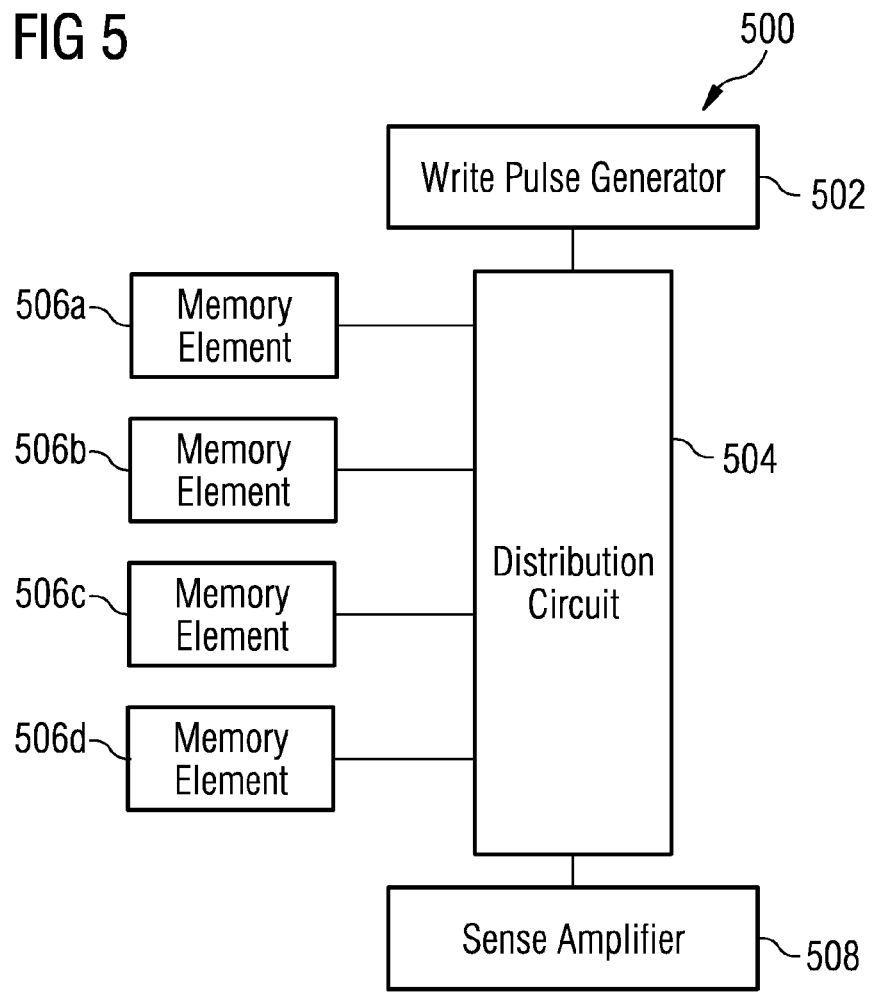
FIG. 5 shows a schematic drawing of an integrated circuit including resistance changing memory cells.

FIG. 5 illustrates a block diagram of a memory device 500 including a write pulse generator 502, a distribution circuit 504, phase change memory elements 506a, 506b, 506c, 506d (for example phase change memory elements 400 as shown in FIG. 2), and a sense amplifier 508. According to one embodiment, the write pulse generator 502 generates current pulses or voltage pulses that are supplied to the phase change memory elements 506a, 506b, 506c, 506d via the distribution circuit 504, thereby programming the memory states of the phase change memory elements 506a, 506b, 506c, 506d. According to one embodiment, the distribution circuit 504 includes a plurality of transistors that direct current pulses or voltage pulses to the phase change memory elements 506a, 506b, 506c, 506d or to heaters being disposed adjacent to the phase change memory elements 506a, 506b, 506c, 506d.

As already indicated, the phase change material of the phase change memory elements 506a, 506b, 506c, 506d may be changed from the amorphous state to the crystalline state (or vice versa) under the influence of a temperature change. More generally, the phase change material may be changed from a first degree of crystallization to a second degree of crystallization (or vice versa) under the influence of a temperature change. For example, a bit value "0" may be assigned to the first (low) degree of crystallization, and a bit value "1" may be assigned to the second (high) degree of crystallization. Since different degrees of crystallization imply different electrical resistances, the sense amplifier 504 is capable of determining the memory state of one of the phase change memory elements 506a, 506b, 506c, or 506d in dependence on the resistance of the phase change material.

To achieve high memory densities, the phase change memory elements 506a, 506b, 506c, 506d may be capable of storing multiple bits of data, i.e. the phase change material may be programmed to more than two resistance values. For example, if a phase change memory element 506a, 506b, 506c, 506d is programmed to one of three possible resistance levels, 1.5 bits of data per memory element can be stored. If the phase change memory element is programmed to one of four possible resistance levels, two bits of data per memory element can be stored, and so on.

The embodiment shown in FIG. 5 may also be applied in a similar manner to other types of resistance changing memory elements like programmable metallization elements (PMCs), magento-resistive memory elements (e.g. MRAMs), organic memory elements (e.g. ORAMs), OxRams, or transition metal oxide memory elements (TMOs).

Another type of resistance changing memory element which may be part of an integrated circuit according to the present invention may be formed using carbon as a resistance changing material. Generally, amorphous carbon that is rich is $sp^3$-hybridized carbon (i.e., tetrahedrally bonded carbon) has a high resistance, while amorphous carbon that is rich in $sp^2$-hybridized carbon (i.e., trigonally bonded carbon) has a low resistance. This difference in resistance can be used in a resistance changing memory cell.

In one embodiment, a carbon memory element may be formed in a manner similar to that described above with reference to phase change memory elements. A temperature-induced change between an $sp^3$-rich state and an $sp^2$-rich state may be used to change the resistance of an amorphous carbon material. These differing resistivities may be used to represent different memory states. For example, a high resistance $sp^3$-rich state can be used to represent a "0", and a low resistance $sp^2$-rich state can be used to represent a "1". It will be understood that intermediate resistance states may be used to represent multiple bits, as discussed above.

Generally, in this type of carbon memory element, application of a first temperature causes a change of high resistance $sp^3$-rich amorphous carbon to relatively low resistance $sp^2$-rich amorphous carbon. This conversion can be reversed by application of a second temperature, which is typically higher than the first temperature. As discussed above, these temperatures may be provided, for example, by applying a current and/or voltage pulse to the carbon material. Alternatively, the temperatures can be provided by using a resistive heater that is disposed adjacent to the carbon material.

Figure 6A:
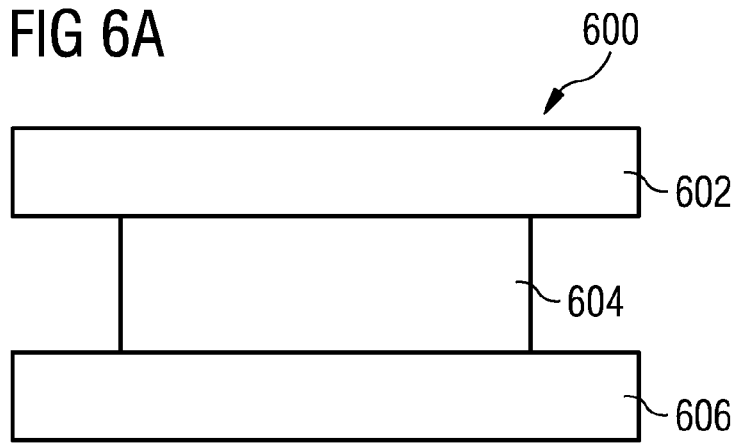
FIG. 6A shows a schematic cross-sectional view of a carbon memory element set to a first switching state.
Figure 6B:
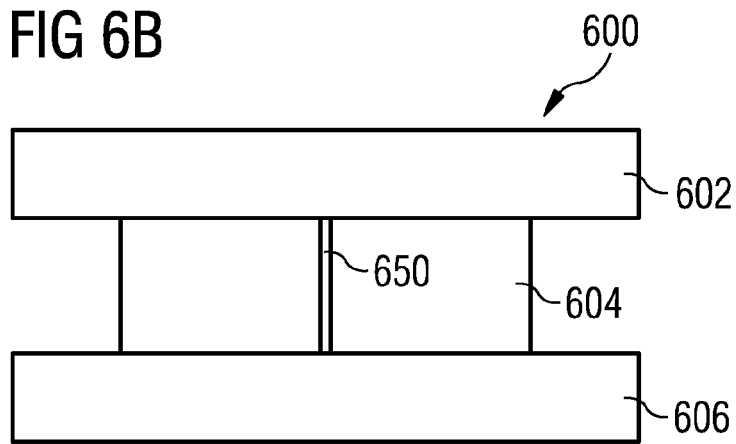
FIG. 6B shows a schematic cross-sectional view of a carbon memory element set to a second switching state.

Another way in which resistance changes in amorphous carbon can be used to store information is by field-strength induced growth of a conductive path in an insulating amorphous carbon film. For example, applying voltage or current pulses may cause the formation of a conductive $sp^2$ filament in insulating $sp^3$-rich amorphous carbon. The operation of this type of resistive carbon memory is illustrated in FIGS. 6A and 6B. FIG. 6A shows a carbon memory element 600 that includes a top contact 602, a carbon storage layer 604 including an insulating amorphous carbon material rich in $sp^3$-hybridized carbon atoms, and a bottom contact 606. As shown in FIG. 6B, by forcing a current (or voltage) through the carbon storage layer 604, an $sp^2$ filament 650 can be formed in the $sp^3$-rich carbon storage layer 604, changing the resistance of the memory element. Application of a current (or voltage) pulse with higher energy (or, in some embodiments, reversed polarity) may destroy the $sp^2$ filament 650, increasing the resistance of the carbon storage layer 604. As discussed above, these changes in the resistance of the carbon storage layer 604 can be used to store information, with, for example, a high resistance state representing a "0" and a low resistance state representing a "1". Additionally, in some embodiments, intermediate degrees of filament formation or formation of multiple filaments in the $sp^3$-rich carbon film may be used to provide multiple varying resistance levels, which may be used to represent multiple bits of information in a carbon memory element. In some embodiments, alternating layers of $sp^3$-rich carbon and $sp^2$-rich carbon may be used to enhance the formation of conductive filaments through the $sp^3$-rich layers, reducing the current and/or voltage that may be used to write a value to this type of carbon memory.

Figure 7A:
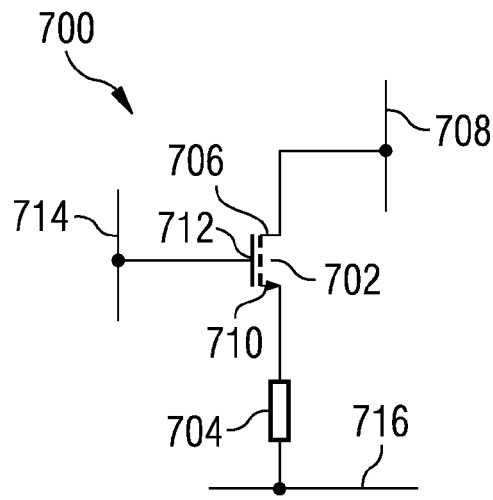
FIG. 7A shows a schematic drawing of an integrated circuit including resistance changing memory elements.

Resistance changing memory elements, such as the phase change memory elements and carbon memory elements described above, may be used as part of a memory cell, along with a transistor, diode, or other active component for selecting the memory cell. FIG. 7A shows a schematic representation of such a memory cell that uses a resistance changing memory element. The memory cell 700 includes a select transistor 702 and a resistance changing memory element 704. The select transistor 702 includes a source 706 that is connected to a bit line 708, a drain 710 that is connected to the memory element 704, and a gate 712 that is connected to a word line 714. The resistance changing memory element 704 also is connected to a common line 716, which may be connected to ground, or to other circuitry, such as circuitry (not shown) for determining the resistance of the memory cell 700, for use in reading. Alternatively, in some configurations, circuitry (not shown) for determining the state of the memory cell 700 during reading may be connected to the bit line 708. It should be noted that as used herein the terms connected and coupled are intended to include both direct and indirect connection and coupling, respectively.

To write to the memory cell 700, the word line 714 is used to select the memory cell 700, and a current (or voltage) pulse on the bit line 708 is applied to the resistance changing memory element 704, changing the resistance of the resistance changing memory element 704. Similarly, when reading the memory cell 700, the word line 714 is used to select the cell 700, and the bit line 708 is used to apply a reading voltage (or current) across the resistance changing memory element 704 to measure the resistance of the resistance changing memory element 704.

Figure 7B:
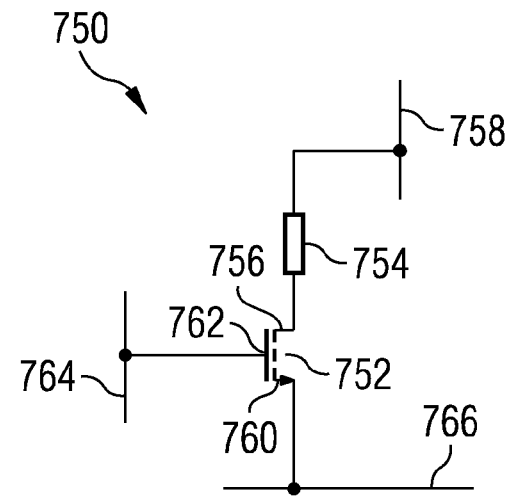
FIG. 7B shows a schematic drawing of an integrated circuit including resistance changing memory elements.

The memory cell 700 may be referred to as a 1T1J cell, because it uses one transistor, and one memory junction (the resistance changing memory element 704). Typically, a memory device will include an array of many such cells. It will be understood that other configurations for a 1T1J memory cell, or configurations other than a 1T1J configuration may be used with a resistance changing memory element. For example, in FIG. 7B, an alternative arrangement for a 1T1J memory cell 750 is shown, in which a select transistor 752 and a resistance changing memory element 754 have been repositioned with respect to the configuration shown in FIG. 7A. In this alternative configuration, the resistance changing memory element 754 is connected to a bit line 758, and to a source 756 of the select transistor 752. A drain 760 of the select transistor 752 is connected to a common line 766, which may be connected to ground, or to other circuitry (not shown), as discussed above. A gate 762 of the select transistor 752 is controlled by a word line 764.

FIG. 8A shows a method 800 of operating an integrated circuit according to one embodiment of the present invention. At 802, writing access numbers which are assigned to the physical memory units are monitored, each writing access number reflecting the number of writing accesses to the physical memory unit to which the writing access number is assigned. At 804, if the value of a writing access number assigned to a first physical memory unit exceeds a writing access threshold value, a data exchange process is carried out during which the data stored within the first physical memory unit is exchanged within the data of a second physical memory unit having a writing access number of a lower value.

One effect of this embodiment is that an excessive use of particular memory cells can be avoided. That is, in the long run, the writing access numbers of all memory cells do not significantly vary from each other. As a consequence, an early failure of particular memory cells (bits) can be avoided.

According to one embodiment of the present invention, in the method 800 shown in FIG. 8A, the writing access number of a physical memory unit is increased by one each time a writing access to the physical memory unit is performed.

According to one embodiment of the present invention, in the method 800 shown in FIG. 8A, a switching number is assigned to each physical memory unit, wherein the switching numbers of the first physical memory unit and of the second physical memory unit are respectively increased by one each time the data stored within the first physical memory unit is exchanged with the data stored within the second physical memory unit.

According to one embodiment of the present invention, in the method 800 shown in FIG. 8A, the second physical memory unit is chosen as follows: determining all physical memory units to which a lowest switching number value is assigned; and choosing, among the physical memory units thus determined, the physical memory unit to which the lowest writing access number value is assigned.

According to one embodiment of the present invention, in the method 800 shown in FIG. 8A, the writing access threshold value is a fixed value. This means that this value is fixed over a larger period of time.

According to one embodiment of the present invention, in the method 800 shown in FIG. 8A, the writing access threshold value is a variable value which is set to the highest writing access number value presently assigned to the physical memory units each time after a predetermined amount of writing accesses have been carried out. For example, after each writing access, the highest writing access number value may be determined, and a corresponding data exchange may be initiated. Alternatively, the highest writing access number value may only be determined after a plurality of writing accesses have been carried out.

According to one embodiment of the present invention, in the method 800 shown in FIG. 8A, during a writing access to a physical memory unit, only a part of the data of the physical memory unit is written.

According to one embodiment of the present invention, in the method 800 shown in FIG. 8A, in order to carry out a writing access to a physical memory unit, only the part of the data of the physical memory unit is written which has to be changed.

According to one embodiment of the present invention, in the method 800 shown in FIG. 8A, in order to carry out a writing access to a physical memory unit, the whole data of the physical memory unit is written.

According to one embodiment of the present invention, in the method 800 shown in FIG. 8A, a logical memory unit is assigned to each physical memory unit.

According to one embodiment of the present invention, in the method 800 shown in FIG. 8A, after having carried a data exchange process between a first physical memory unit and a second physical memory unit, a first logical memory unit assigned to the first physical memory unit is assigned to the second physical memory unit, and a second logical data unit assigned to the second physical memory unit is assigned to the first physical memory unit.

According to one embodiment of the present invention, in the method 800 shown in FIG. 8A, in order to read data represented by a logical memory unit, data of the corresponding physical memory unit is copied into a buffer, and the data of the buffer is read out.

According to one embodiment of the present invention, in the method 800 shown in FIG. 8A, in order to write data represented by a logical memory unit, data is copied into a buffer, and the data of the buffer is written into the corresponding physical memory unit.

According to one embodiment of the present invention, in the method 800 shown in FIG. 8A, in order to exchange data stored within the first physical memory unit with data stored within the second physical memory unit, the data stored within the first physical memory unit is copied into a buffer, the content stored within the second physical memory unit is copied into the first physical memory unit, and the content stored within the buffer is copied into the second physical memory unit.

According to one embodiment of the present invention, in the method 800 shown in FIG. 8A, the memory units are memory pages.

According to one embodiment of the present invention, in the method 800 shown in FIG. 8A, the memory pages are grouped into memory blocks.

FIG. 8B shows a method 850 of operating an integrated circuit according to one embodiment of the present invention. At 852, the physical memory unit within which data to be accessed is stored is determined. At 854, the data stored within the physical memory unit is copied into a buffer. In one embodiment, the buffer memory consists of SRAM memory cells. In a different embodiment, the buffer memory consists of DRAM memory cells. In yet a different embodiment, the buffer memory consists of capacitor-less DRAM memory cells ("ZRAM"). At 856, if data has to be read from the physical memory unit, corresponding data is read from the buffer, and if data has to be written into the physical memory unit, the data is written into the buffer. At 858, it is determined whether the next data access process(es) concern(s) only data stored within the physical memory unit. If this is the case, the method returns to 856, and the next data access processes are carried out. If this is not the case, the method proceeds to 860, wherein, as soon as data stored within a further physical memory unit has to be accessed, the data stored within the buffer or only data of the buffer which has been changed due to data writing accesses is copied into the physical memory unit. Then, the method returns to 852.

One effect of this embodiment is that the endurance of the resistance changing memory cells is enhanced since data is only written into a physical memory unit if data access changes from the physical memory unit to a different physical memory unit. That is, as long as data access is restricted to one physical memory unit, all data is only written to/read from the buffer, and not to/from the physical memory unit; only the "result" of several data access processes (i.e. the data change) is written at once into the physical memory unit.

All embodiments described in conjunction with method 800 can also be applied to/combined with method 850. For example, the buffer may additionally be used for a data exchange process as described in FIG. 8A.

Figure 9:
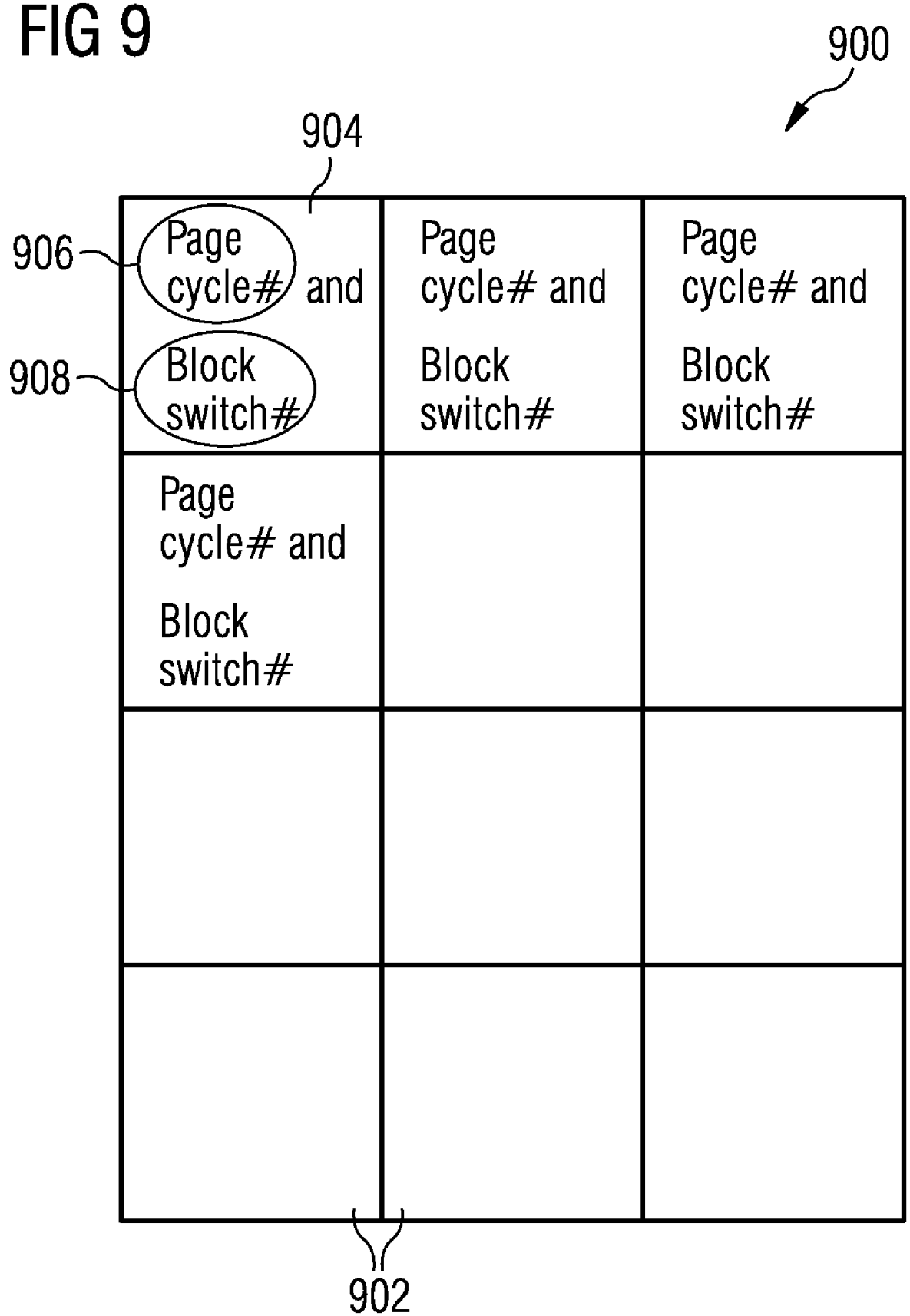
FIG. 9 shows a schematic drawing of a memory cell array data structure of an integrated circuit according to one embodiment of the present invention.

FIG. 9 shows an example of a possible data structure of a memory cell array of an integrated circuit according to one embodiment of the present invention.

FIG. 9 shows a memory block 900 divided into several memory pages 902. The memory cell array may be divided up into a plurality of memory pages 900. To each memory page 902 a writing access number (here referred to as "page cycle" number) and a switching number (here referred to as "blocks switch" number) is assigned. The page cycle number reflects the number of writing accesses to the memory page, whereas the block switch number represents the number of data exchange processes during which the data of a memory page 902 is exchanged with the data of a memory page 902. For example, each time data is written to a memory page 904, the value of the page cycle number 906 of the memory page 904 is increased by one. Further, each time the data of the memory page 904 is exchanged with the data of a different memory page 902, the value of the block switch number 908 is increased by one.

Figure 10:
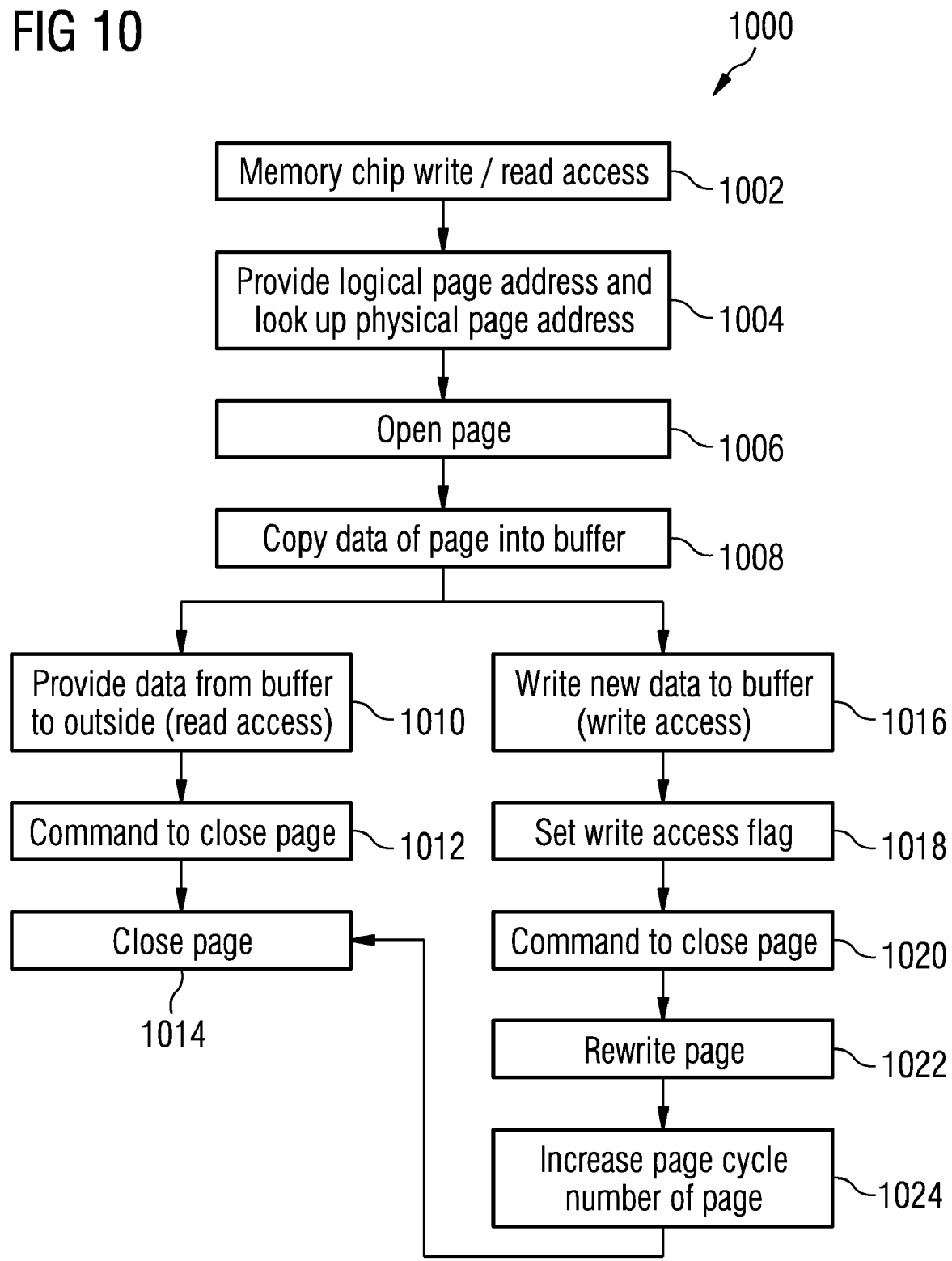
FIG. 10 shows a flow chart of a method of operating an integrated circuit according to one embodiment of the present invention.

FIG. 10 shows a method 1000 of operating an integrated circuit according to one embodiment of the present invention. At 1002, a memory chip read/write access is started. At 1004, the logical page address to which data has to be written/from which data is to be read is determined. Once the logical page address has been determined, the corresponding physical page address is determined. At 1006, the physical page is opened. At 1008, the data of the physical page is copied into a buffer. If the memory chip access is a read access, at 1010, the data of the page (or at least a part thereof) is provided from the buffer to the outside. Then, at 1012, a command is given to close the physical page. At 1014, the physical page is closed. On the other hand, if the memory chip access is a write access, the data to be written to the physical page is written into the buffer at 1016. At 1018, a write access flag is set. At 1020, a command is given to close the physical page. Then, at 1022, the physical page is rewritten (the data stored in the buffer is written to the physical page). At 1024, the page cycle number of the respective physical page is increased (i.e. the writing access number of the respective blog is increased). Then, at 1014, the physical page is closed.

Figure 11:
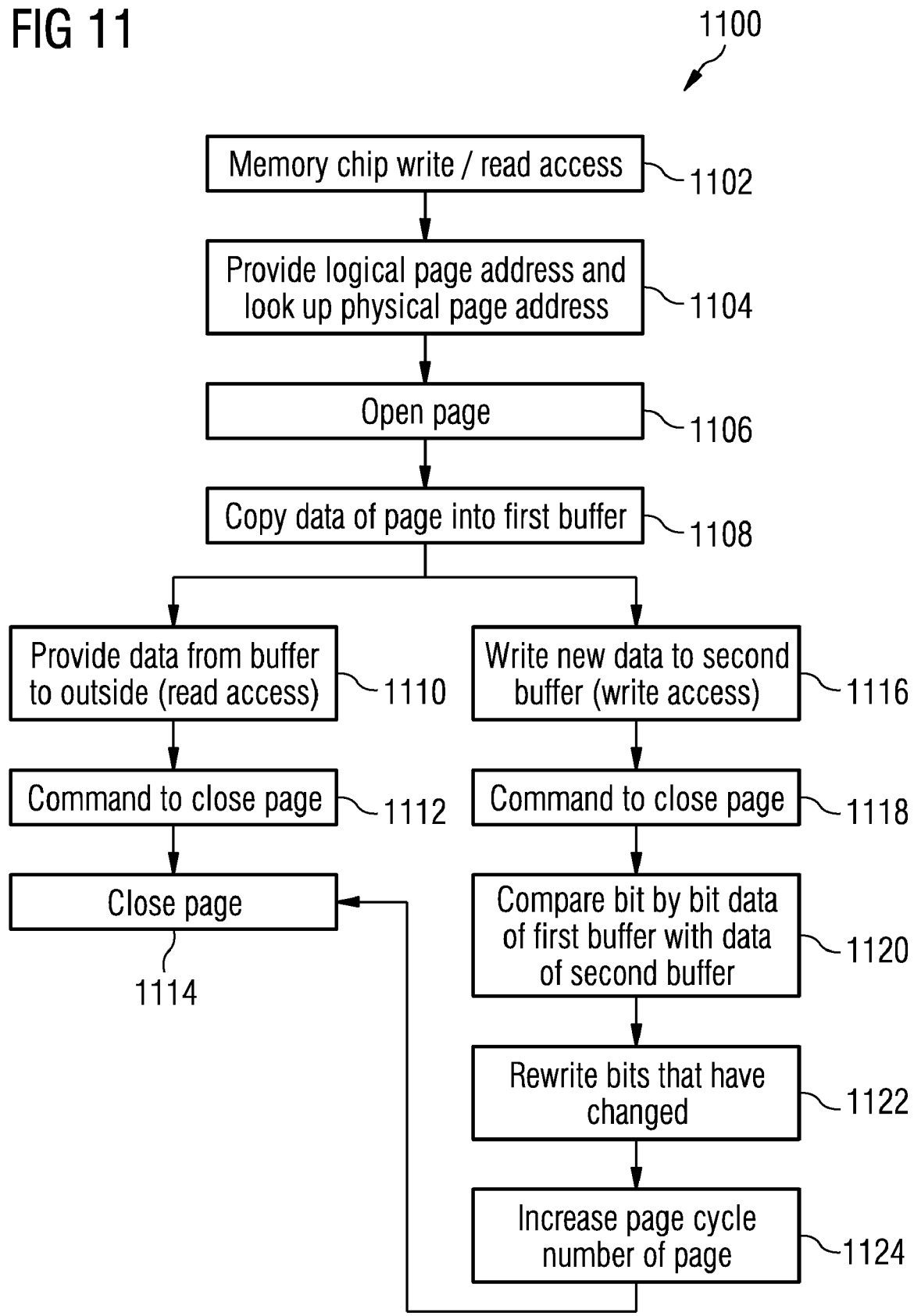
FIG. 11 shows a flow chart of a method of operating an integrated circuit according to one embodiment of the present invention.

FIG. 11 shows a method 1100 of operating an integrated circuit according to one embodiment of the present invention. At 1102, a memory chip read/write access is started. At 1104, the logical page address to which data has to be written/from which data is to be read is determined. Once the logical page address has been determined, the corresponding physical page address is determined. At 1106, the physical page is opened. At 1108, the data of the physical page is copied into a first buffer. If the memory chip access is a read access, at 1110, the data of the physical page (or at least a part thereof) is provided from the first buffer to the outside. Then, at 1112, a command is given to close the physical page. At 1014, the physical page is closed. On the other hand, if a write access is performed, the data to be written to the physical page is written into a second buffer at 1116. Then, at 1118, a command to close the opened page is generated. As a response thereto, at 1120, a bit by bit data comparing process between the data content of the first buffer and the data content of the second buffer is carried out. At 1122, bits that have been changed are rewritten (i.e. bits that have been changed an odd number of times are written from the second buffer to the physical page). Bits that have not been changed or have been changed an even number of times are not rewritten. At 1124, the page cycle number (i.e. the writing access number) of the physical page into which data has been written is increased by one. Then, at 1114, the physical page is closed. An advantage of method 1100 over method 1000 is that the average number of write accesses to the memory cells is lowered, taking advantage of the bit-wise overwrite capabilities of the resistive memory cells.

Figure 12:
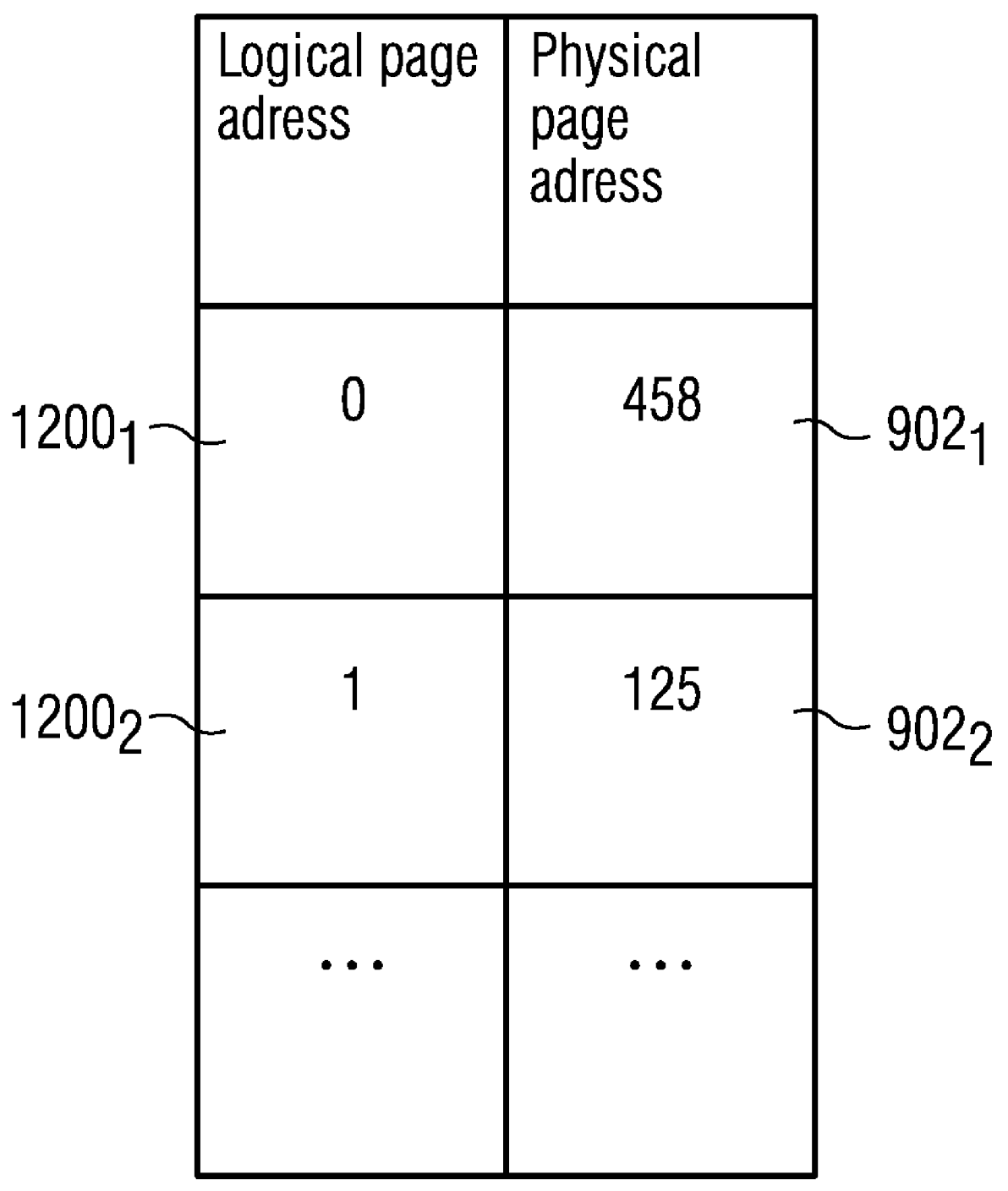

FIG. 12 shows an example of a mapping of a logical page address to a physical page address. In this example, a logical memory page $1200_1$ having the logical page address "0" has been mapped to a physical memory page $902_1$ having the physical page address "458". Further, a logical memory page $1200_2$ having the logical page address "1" has been mapped to a physical memory page $902_2$ having the physical page address "125". Each time a data exchange process is carried out, this mapping is updated. For example, the data stored within the physical memory page $902_1$ having the physical page address 458 may be copied into the physical memory page $902_2$ having the physical page address 125, whereas the data stored within the physical memory page $902_2$ having the memory block address 125 is copied into the physical memory page $902_1$ having the physical page address 458. In this example, the logical memory page $1200_1$ having the logical page address 0 is then assigned to the physical memory page $902_2$ having the physical page address 125, and the logical memory page $1200_2$ having the logical page address 1 is then assigned to the physical memory page $902_1$ having the physical page address 458.

Figure 13:
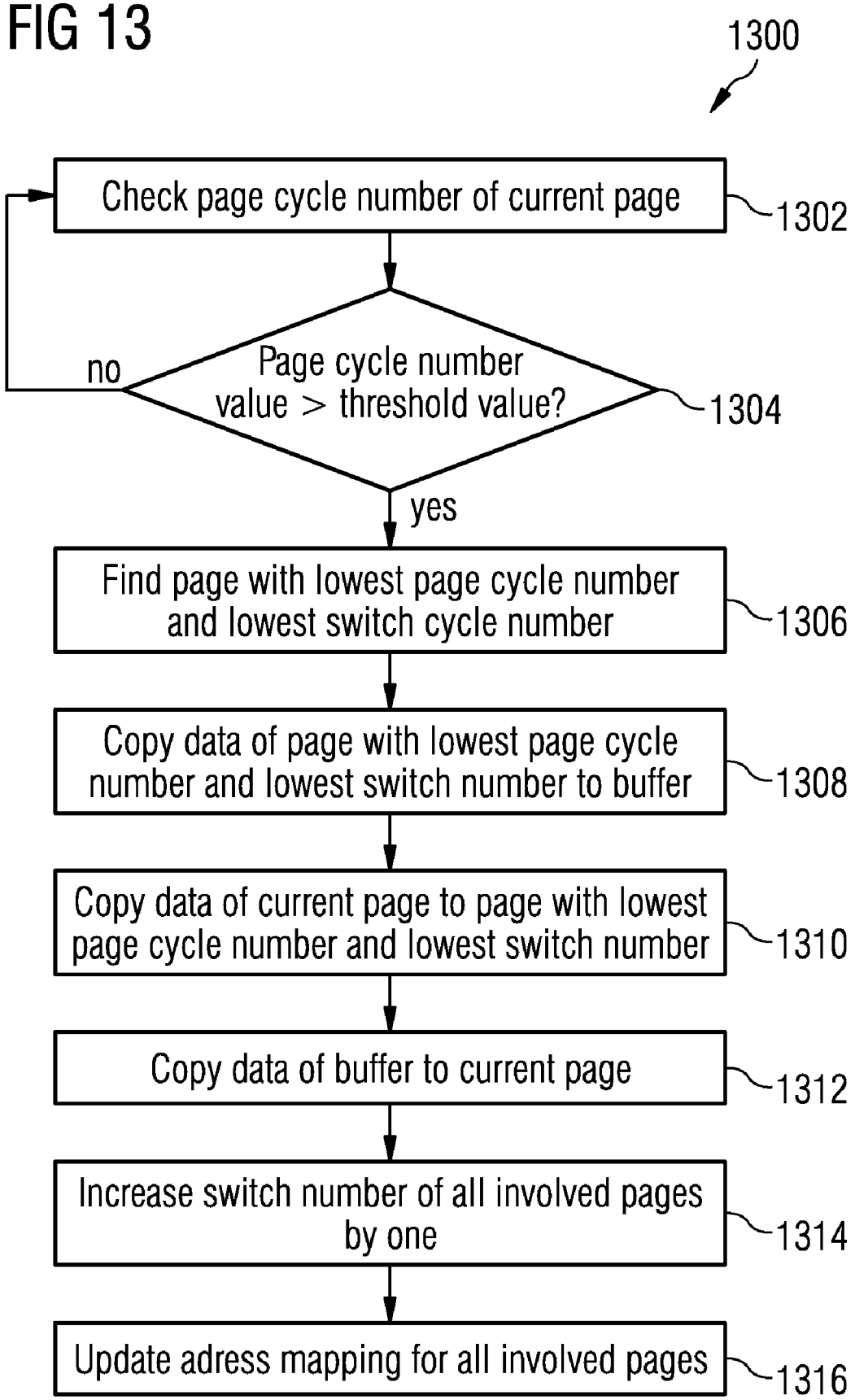
FIG. 13 shows a flow chart of a method of operating an integrated circuit according to one embodiment of the present invention.

FIG. 13 shows a method 1300 of operating an integrated circuit according to one embodiment of the present invention. At 1302, the page cycle number of a physical page (current page) is checked. At 1304 it is determined whether the page cycle number of the current page is larger than a predetermined threshold value. If no, the method returns to 1302 and checks the page cycle number of a further physical page. If yes, at 1306, the physical pages having the lowest switch numbers are determined. Further, among the physical pages thus determined, the page having the lowest page cycling number is determined. Then, at 1308, data of the page determined at 1306 is copied to a buffer. At 1310, data of the current page is copied to the page determined at 1306. Further, at 1312, data of the buffer is copied to the current page. Then, at 1314, the switch numbers of all involved physical pages (current page and page determined at 1306) are respectively increased by one. Last, at 1316, the mapping between the logical pages assigned to the current physical page and the physical page determined at 1306 is changed. The method 1300 may for example be performed as a maintenance process (not regularly, initiated by demand), each time a writing access to the integrated circuit is performed, or may be triggered by a ECC bit error rate as determined from error correction code circuitry.

Figure 14:
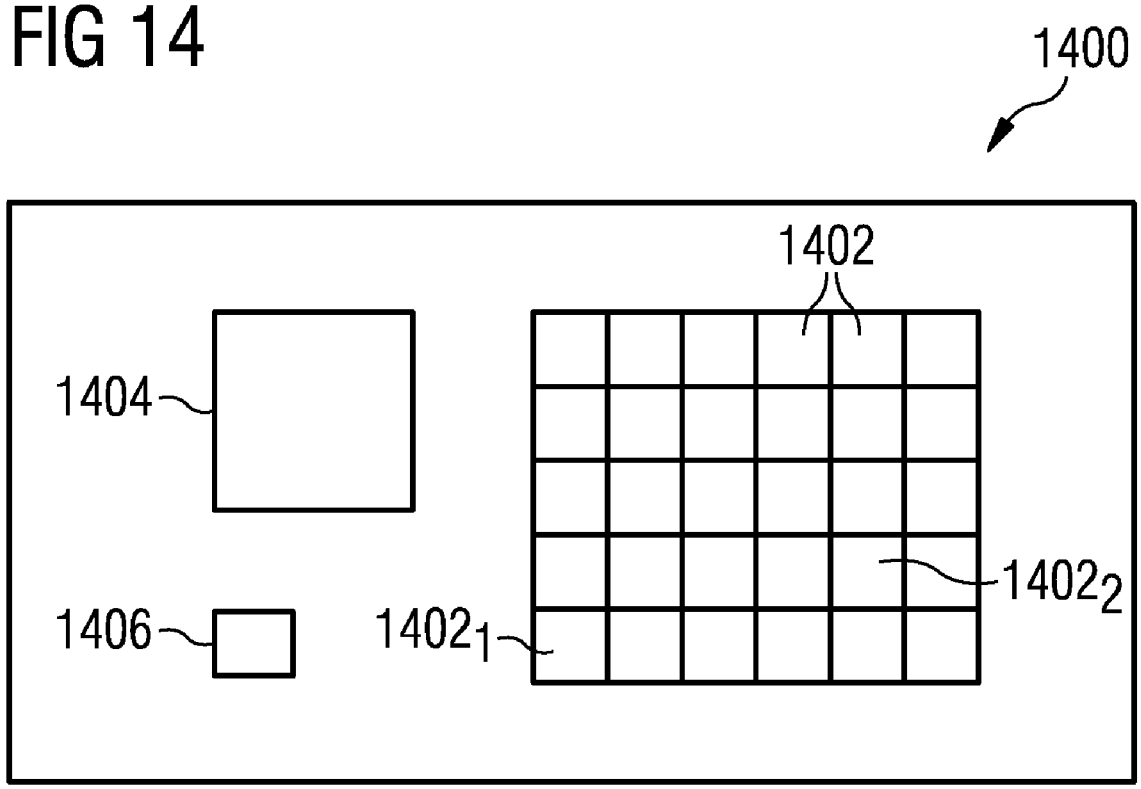
FIG. 14 shows a schematic drawing of an integrated circuit according to one embodiment of the present invention.

FIG. 14 shows an integrated circuit 1400 according to one embodiment of the present invention. The integrated circuit 1400 includes a plurality of resistance changing memory cell grouped into physical memory units 1402. The integrated circuit 1300 further includes a monitoring unit 1404 which monitors writing access numbers assigned to the physical memory units 1402. Each writing access number reflects the number of writing access to the physical memory unit to which the writing access number is assigned. The monitoring unit 1404 triggers, if the value of a writing access number assigned to a first physical memory unit 1402 exceeds a writing access threshold value, a data exchange process is carried out during which the data content stored within the first physical memory unit 1402 is exchanged with the data content of a second physical memory unit 1402 having a writing access number of a lower value. For example, the monitoring unit 1404 triggers, if the value of a writing access number assigned to a first physical memory unit $1402_1$ exceeds a writing access threshold value, a data exchange process is carried out during which the data content stored within the first physical memory unit $1402_1$ is exchanged with the data content of a second physical memory unit $1402_2$ having a writing access number of a lower value.

According to one embodiment of the present invention, the monitoring unit 1404 is adapted to increase the writing access number of a physical memory unit 1402 by one each time a writing access to the physical memory unit 1402 is performed.

According to one embodiment of the present invention, a switching number is assigned to each physical memory unit 1402, wherein the monitoring unit 1404 is adapted to respectively increase the switching numbers of the first physical memory unit 1402 and of the second physical memory 1402 unit by one each time the data stored within the first physical memory unit 1402 is exchanged with the data stored within the second physical memory unit 1402.

For example, the monitoring unit 1404 may be adapted to respectively increase the switching numbers of the first physical memory unit 1402$_1$ and of the second physical memory 1402$_2$ unit by one each time the data stored within the first physical memory unit 1402$_1$ is exchanged with the data stored within the second physical memory unit 1402$_2$.

According to one embodiment of the present invention, the monitoring unit 1404 is adapted to choose the second physical memory unit 1402$_2$ as follows: determining all physical memory units to which a lowest switching number value is assigned, and choosing, among the physical memory units thus determined, the physical memory unit to which the lowest writing access number value is assigned.

According to one embodiment of the present invention, the integrated circuit 1400 includes a buffer 1406, wherein, in order to exchange data stored within the first physical memory unit 1402$_1$ with data stored within the second physical memory unit 1402$_2$, the data stored within the first physical memory unit 1402$_1$ is copied into the buffer 1406, the content stored within the second physical memory unit 1402$_2$ is copied into the first physical memory unit 1402$_1$, and the content stored within the buffer 1406 is copied into the second physical memory unit 1402$_2$. Here, the buffer 1406 is a unit separated from the physical memory units 1402 like a SRAM (Static RAM) or DRAM (Dynamic RAM) or FRAM (Ferroelectric RAM) or ZRAM buffer. Generally, this buffer should be fast and should not have endurance limitations. However, the buffer may also be one of the physical memory units 1402.

According to one embodiment of the present invention, the monitoring unit 1404 includes a controlling unit (not shown) being configured to additionally or alternatively carry out the following method: a) determine a physical memory unit 1402 within which data to be accessed is stored (here, it is assumed that this physical memory unit is the first physical memory unit 1402$_1$); b) initiate a copy process in order to copy the data stored within the physical memory unit 1402$_1$ into the buffer 1406; if data has to be read from the physical memory unit 1402$_1$, read corresponding data from the buffer 1406, and if data has to be written into the physical memory unit 1402$_1$, write the data into the buffer 1406, wherein the controlling unit carries out c) as long as only data stored within the physical memory unit 1402$_1$ has to be accessed, d) as soon as data stored within a different physical memory unit 1402 (here, it is assumed that this different physical memory unit 1402 is the second physical memory unit 1402$_2$) has to be accessed, initiate a copy process in order to copy the data stored within the buffer 1406 or copy only a part of the data of the buffer 1406 which has been changed due to data writing accesses into the physical memory unit 1402$_1$. Then, processes a) to d) are repeated for the different physical memory unit 1402 (i.e. the physical memory unit 1402 determined in a) is now the physical memory unit 1402$_2$).

In this way, the buffer 1406 may both be used for data exchange processes as discussed in conjunction with FIG. 8A, and as data reading/writing interface as discussed in conjunction with FIG. 8B.

Generally, all embodiments discussed in conjunction with method 800/850 may also be applied to the embodiments of the integrated circuit 1400.

Figure 15A:
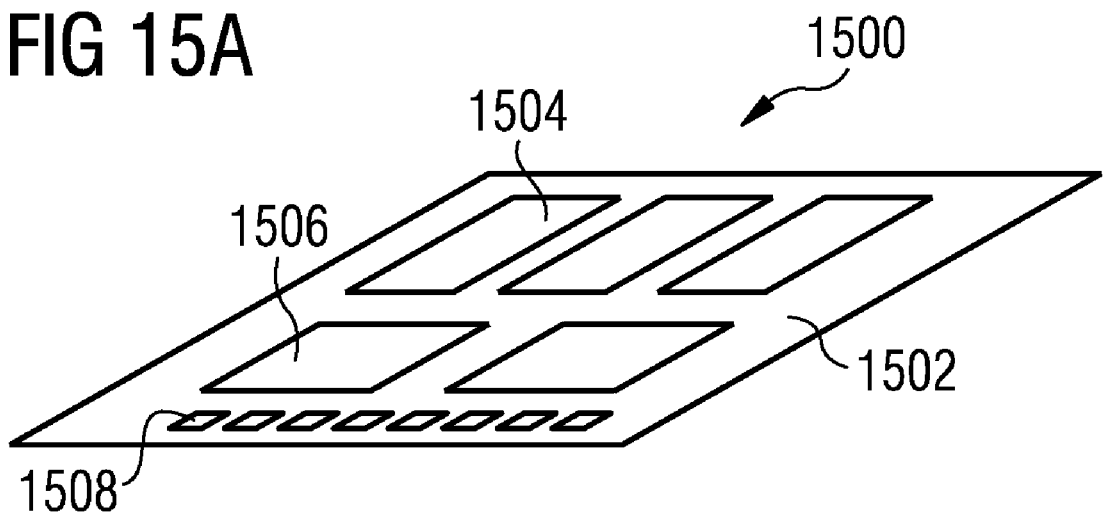
FIG. 15A shows a schematic perspective view of a memory module according to one embodiment of the present invention.
Figure 15B:
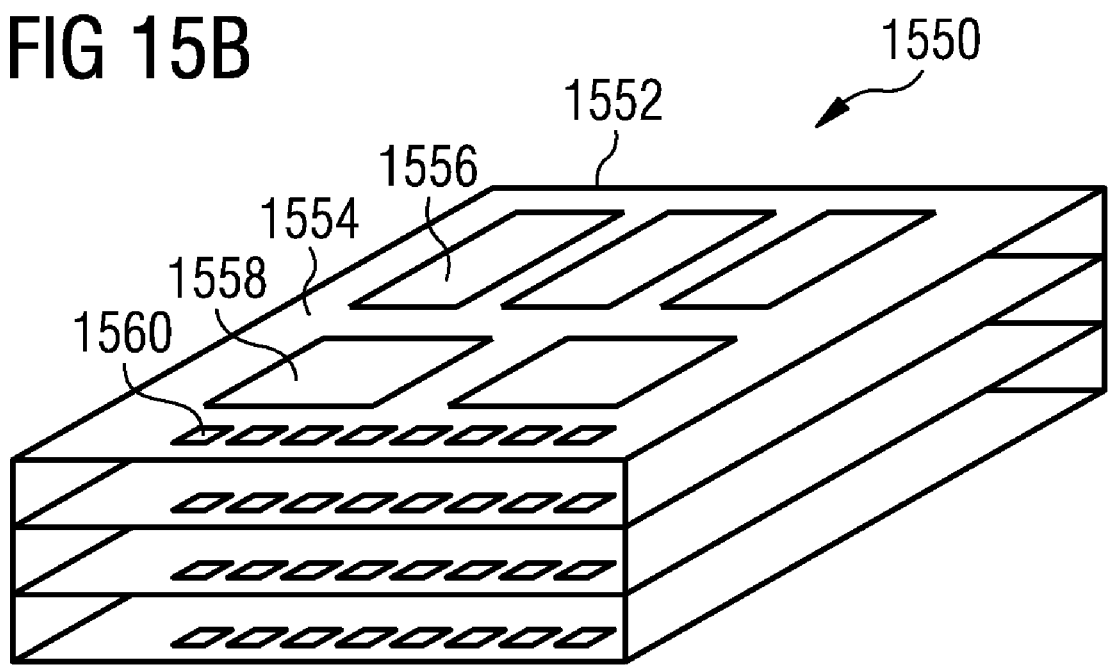
FIG. 15B shows a schematic perspective view of a memory module according to one embodiment of the present invention.

As shown in FIGS. 15A and 15B, in some embodiments, integrated circuits such as those described herein may be used in modules. In FIG. 15A, a memory module 1500 is shown, on which one or more integrated circuits 1504 are arranged on a substrate 1502. The memory module 1500 may also include one or more electronic devices 1506, which may include memory, processing circuitry, control circuitry, addressing circuitry, bus interconnection circuitry, or other circuitry or electronic devices that may be combined on a module with a memory device, such as the integrated circuit 1504. Additionally, the memory module 1500 includes multiple electrical connections 1508, which may be used to connect the memory module 1500 to other electronic components, including other modules.

As shown in FIG. 15B, in some embodiments, these modules may be stackable, to form a stack 1550. For example, a stackable memory module 1552 may contain one or more integrated circuits 1556, arranged on a stackable substrate 1554. The stackable memory module 1552 may also include one or more electronic devices 1558, which may include memory, processing circuitry, control circuitry, addressing circuitry, bus interconnection circuitry, or other circuitry or electronic devices that may be combined on a module with a memory device, such as the integrated circuits 1556. Electrical connections 1560 are used to connect the stackable memory module 1552 with other modules in the stack 1550, or with other electronic devices. Other modules in the stack 1550 may include additional stackable memory modules, similar to the stackable memory module 1552 described above, or other types of stackable modules, such as stackable processing modules, control modules, communication modules, or other modules containing electronic components.

In the following description further features of embodiments of the present invention will be explained.

According to one embodiment of the present invention, a 1 Gb memory array is organized as follows: The array is divided into 1024 blocks, each block having 1 Mb of memory. Each 1 Mb block is then divided into 1024 pages having 1 kb of memory. Each memory page requires a page cycle number (which needs e.g. 27 bits of memory) and a switch number (which needs for example 10 bits of memory). This means in this example that each memory block needs 40 kb memory overhead in order to carry out the inventive method. The memory needed by the block address translation table (mapping between logical pages and physical pages) is 1024*10 bit=10 kb. Given a broadly distributed access pattern, this can be lead to an average chip endurance of 1e12 on the basis of an average cell endurance of 1e8: Out of the 1e12 bit rewrites, a factor of 10 is already captured within the buffer page, leading to 1e11 rewrites to the physical memory cells. Of these 1e11 rewrites, 1e8 are done within one physical page, which is then swapped out 1e3 times.

According to one embodiment of the present invention, the memory array is divided into pages and blocks, wherein possible sizes could for example be 2 k pages and 4M blocks. According to one embodiment of the present invention, a DRAM-like interface is provided which is used to open a page for read/write access within this page. The occurring write accesses to the different bit locations within the open page are captured in an on-chip buffer, e.g. SRAM cells. Once the page is closed and written to the nonvolatile (NV) memory array, a special write access counter associated with the page is increased by 1. Once this page write access counter exceeds a certain limit (in the worst case this is the number of times a single memory cell of this block has been re-written), a page swap is initiated.

During this page swap, the memory address and content of the page with the statistically highest write access count are swapped with the page with the lowest usage. A switch counter records the number of times this page has already been replaced.

This scheme creates a good statistical measure of write access counts to the bits within a certain portion of the memory array. Simultaneously, numerous re-writes to a bit within 1 page are already eliminated, since the page is only rewritten once during closing of the page.

This scenario is fairly likely, since for example operating system (O/S) counters will produce this characteristic. In addition, the overhead required for wear book-keeping and tracking in a random write access memory is reduced to a minimum.

In this way, according to one embodiment of the present invention, a wear levelling strategy for resistive memories with DRAM-like interface is provided. It employs an averaged page write access counter as a statistical sample of page usage, to allow a tracking of memory wear with minimum overhead requirements as well as suppressing interpage cycling of individual bits.

In case PCRAM is intended to be used for main memory applications (among others, providing DRAM functionality), a key challenge is the limited endurance of the individual PCRAM memory cell. Although PCRAM cell endurance may exceed the 1e10 level continuous toggling of individual bits could quickly cause single bits failures.

In the present invention disclosure, a write architecture and wear levelling scheme is disclosed, which effectively prevents premature failure of individual bits by buffering of the rewrite cycles within a page and balancing the wear among all available storage locations. In this way, continuous toggling of individual bits (limited endurance) which could quickly cause single bits failures is avoided.

In other words: a wear leveling strategy for resistive memories with DRAM-like interface is proposed. It employs an averaged page write access counter as a statistical sample of block usage, to allow a tracking of memory wear with minimum overhead requirements as well as suppressing interpage cycling of individual bits.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A method of operating an integrated circuit comprising a plurality of resistance changing memory cells grouped into physical memory units, the method comprising:
   monitoring writing access numbers assigned to the physical memory units, each writing access number reflecting a number of writing accesses to the physical memory unit to which the writing access number is assigned,
   if the value of a writing access number assigned to a first physical memory unit exceeds a writing access threshold value, a data exchange process is carried out during which data stored within the first physical memory unit is exchanged with data content of a second physical memory unit having a writing access number of a lower value,
   wherein the writing access number of a physical memory unit is increased by one each time a writing access to the physical memory unit is performed; and
   wherein a switching number is assigned to each physical memory unit, wherein the switching numbers of the first physical memory unit and of the second physical memory unit are respectively increased by one each time the data stored within the first physical memory unit is exchanged with the data stored within the second physical memory unit.

2. The method according to claim 1,
wherein the writing access threshold value is a fixed value.

3. The method according to claim 1,
wherein the writing access threshold value is a variable value which is set to a highest writing access number value presently assigned to the physical memory units each time after a predetermined amount of writing accesses have been carried out.

4. The method according to claim 1,
wherein, during a writing access to one or more physical memory units, only a portion of the resistance changing memory cells comprising the physical memory unit are written.

5. The method according to claim 4,
wherein, in order to carry out a writing access to one or more physical memory units, only the portion of the resistance changing memory cells comprising the physical memory unit in which data need to be changed is written.

6. The method according to claim 1,
wherein, in order to carry out a writing access to one or more physical memory units, the plurality of physical memory cells comprising the physical memory unit is written.

7. The method according to claim 1,
wherein a logical memory unit is assigned to each physical memory unit.

8. The method according to claim 7,
wherein, after having carried out a data exchange process between a first physical memory unit and a second physical memory unit, a first logical memory unit assigned to the first physical memory unit is assigned to the second physical memory unit, and a second logical memory unit assigned to the second physical memory unit is assigned to the first physical memory unit.

9. The method according to claim 7,
wherein, in order to read data represented by a logical memory unit, data of the corresponding physical memory unit is copied into a buffer, and the data of the buffer is read out.

10. The method according to claim 7,
wherein, in order to write data represented by a logical memory unit, data is copied into a buffer, and the data of the buffer is written into the corresponding physical memory unit.

11. The method according to claim 1,
wherein, in order to exchange data stored within the first physical memory unit with data stored within the second physical memory unit, the data stored within the first physical memory unit is copied into a buffer, the content stored within the second physical memory unit is copied into the first physical memory unit, and the content stored within the buffer is copied into the second physical memory unit.

12. The method according to claim 1,
wherein the physical memory units are memory pages.

13. A method of operating an integrated circuit comprising a plurality of resistance changing memory cells grouped into physical memory units, the method comprising:
- monitoring writing access numbers assigned to the physical memory units, each writing access number reflecting a number of writing accesses to the physical memory unit to which the writing access number is assigned,
- if the value of a writing access number assigned to a first memory unit exceeds a writing access threshold value, a data exchange process is carried out during which data stored within the first physical memory unit is exchanged with data content of a second physical memory unit having a writing access number of a lower value,
- wherein the writing access number of a physical memory unit is increased by one each time a writing access to the physical memory unit is performed,
- wherein a switching number is assigned to each physical memory unit, wherein the switching numbers of the first physical memory unit and of the second physical memory unit are respectively increased by one each time the data stored within the first physical memory unit is exchanged with the data stored within the second physical memory unit, and
- wherein the second physical memory unit is chosen as follows:
- determining all physical memory units to which a lowest switching number value is assigned, and
- choosing, among the physical memory units thus determined, the physical memory unit to which a lowest writing access number value is assigned.

14. An integrated circuit, comprising,
- a plurality of resistance changing memory cells grouped into physical memory units,
- a monitor configured to monitor writing access numbers assigned to the physical memory units each writing access number reflecting a number of writing accesses to the physical memory unit to which the writing access number is assigned, wherein the monitor is configured to trigger, if the value of a writing access number assigned to a first physical memory unit exceeds a writing access threshold value, a data exchange process during which data content stored within a first physical memory unit is exchanged with data content of a second physical memory unit having a writing access number of a lower value,
- wherein the monitor is configured to increase the writing access number of a physical memory unit by one each time a writing access to the physical memory unit is performed, and
- wherein a switching number is assigned to each physical memory unit, wherein the monitor is configured to respectively increase the switching numbers of the first physical memory unit and of the second physical memory unit by one each time the data stored within the first physical memory unit is exchanged with the data stored within the second physical memory unit.

15. The integrated circuit according to claim 14, wherein the writing access threshold value is a fixed value.

16. The integrated circuit according to claim 14, wherein the writing access threshold value is a variable value which is set by the monitor to a highest writing access number value presently assigned to the physical memory units each time after a predetermined amount of writing accesses have been carried out.

17. The integrated circuit according to claim 14, further comprising a buffer, wherein, in order to exchange data stored within the first physical memory unit with data stored within the second physical memory unit, the data stored within the first physical memory unit is copied into the buffer, the content stored within the second physical memory unit is copied into the first physical memory unit, and the content stored within the buffer is copied into the second physical memory unit.

18. An integrated circuit, comprising,
- a plurality of resistance changing memory cells grouped into physical memory units,
- a monitor configured to monitor writing access numbers assigned to the physical memory units, each writing access number reflecting a number of writing accesses to the physical memory unit to which the writing access number is assigned, wherein the monitor is configured to trigger, if the value of a writing access number assigned to a first physical memory unit exceeds a writing access threshold value, a data exchange process during which data content stored within a first physical memory unit is exchanged with data content of a second physical memory unit having a writing access number of a lower value,
- wherein the monitor is configured to increase the writing access number of a physical memory unit by one each time a writing access to the physical memory unit is performed, and
- wherein a switching number is assigned to each physical memory unit, wherein the monitor is configured to respectively increase the switching numbers of the first physical memory unit and of the second physical memory unit by one each time the data stored within the first physical memory unit is exchanged with the data stored within the second physical memory unit,
- wherein the monitor is configured to choose the second physical memory unit as follows:
- determining all physical memory units to which a lowest switching number value is assigned, and
- choosing, among the physical memory units thus determined, the physical memory unit to which a lowest writing access number value is assigned.

* * * * *